United States Patent [19]
Lee et al.

[11] Patent Number: 5,620,928
[45] Date of Patent: Apr. 15, 1997

[54] ULTRA THIN BALL GRID ARRAY USING A FLEX TAPE OR PRINTED WIRING BOARD SUBSTRATE AND METHOD

[75] Inventors: Shaw W. Lee, Cupertino; Anthony E. Panczak, Sunnyvale; Jagdish G. Belani, Cupertino, all of Calif.

[73] Assignee: National Semiconductor Corporation, Santa Clara, Calif.

[21] Appl. No.: 439,362

[22] Filed: May 11, 1995

[51] Int. Cl.$^6$ .................................................. H01L 21/60
[52] U.S. Cl. ........................ 438/118; 438/126; 438/124; 29/841; 29/855
[58] Field of Search ..................................... 437/209, 211, 437/214, 215, 217, 218, 219, 220

[56] References Cited

U.S. PATENT DOCUMENTS

| | | | |
|---|---|---|---|
| 5,102,829 | 4/1992 | Cohn | 437/217 |
| 5,292,688 | 3/1994 | Hsiao et al. | 437/209 |
| 5,340,771 | 8/1994 | Rostoker | 437/209 |
| 5,474,958 | 12/1995 | Djennas et al. | 437/211 |
| 5,490,324 | 2/1996 | Newman | 437/209 |

*Primary Examiner*—Kevin Picardat
*Attorney, Agent, or Firm*—Hickman Beyer & Weaver

[57] ABSTRACT

A method of manufacturing an integrated circuit package assembly including (i) an integrated circuit die having a bottom surface and a plurality of input/output terminals, (ii) electrically conductive traces and/or contacts accessible from outside the assembly, and (iii) an encapsulating material encapsulating the integrated circuit die and portions of the electrically conductive traces and/or contacts will be disclosed. The method includes the following steps. First, a temporary support substrate or carrier having a top surface is provided for supporting the integrated circuit package as the package is being assembled. Then, the integrated circuit die is detachably supported on the top surface of the temporary support substrate. Each of the input/output terminals on the integrated circuit die are electrically connected to the electrically conductive traces and/or contacts. Next, the integrated circuit die and at least a portion of the electrically conductive traces and/or contacts are encapsulated with the encapsulating material such that the bottom surface of the integrated circuit die supported by the temporary support substrate is not covered by the encapsulating material. Finally, the encapsulated integrated circuit die is detached from the temporary support substrate.

21 Claims, 4 Drawing Sheets

ULTRA THIN BALL GRID ARRAY USING A FLEX TAPE OR PRINTED WIRING BOARD SUBSTRATE AND METHOD

BACKGROUND OF THE INVENTION

The present invention relates generally to integrated circuit packaging and more specifically to an Ultra Thin Ball Grid Array (UTBGA) integrated circuit package and a method of making the package which uses a temporary supporting substrate carrier to support the components of the package during the assembly of the package.

In the field of integrated circuit packaging, the cost and size of the overall package are major concerns. Any reduction in the cost of producing the package or reduction in the size or thickness of the package can provide a significant commercial advantage. To this end, the packaging of integrated circuits is continuously being improved to provide more cost effective designs and methods of producing integrated circuit packages.

There are currently several types of prior an Ball Grid Array (BGA) packages currently available. These prior an types include the Plastic Ball Grid Array (PBGA), the Ceramic Ball Grid Array (CBGA), and the Tape Ball Grid Array (TBGA). The PBGA and the TBGA are the thinnest ball grid array packages currently available. Referring to FIG. 1, a typical prior art PBGA integrated circuit package generally indicated by reference numeral 10 will be described. Prior art package 10 includes a dielectric substrate 12 an integrated circuit die 14, an array of bonding wires 16, an encapsulating material 18, and an array of contacts or solder balls 20.

As shown in FIG. 1, substrate 12 has a top surface 22, a bottom surface 24, a plurality of electrically conductive terminal pads 26 on the top surface 22 of substrate 12, a plurality of contact terminal pads 28 on the bottom surface 24 of substrate 12, and a plurality of electrically conductive traces (not shown). Each of the electrically conductive traces interconnects a respective one of terminal pads 26 on the top of substrate 12 to an associated contact terminal pad 28 on the bottom of substrate 12. Substrate 12 is made from a rigid material capable of supporting the other components of the package during the assembly of the package. Integrated circuit die 14 has a top surface 30, a bottom surface 32, and includes a plurality of input/output terminals 34 on its top surface 30. Each of the bonding wires 16 electrically connect a respective one of terminal pads 34 to an associated terminal pad 26 on the top surface of substrate 12. Encapsulating material 18 encapsulates integrated circuit die 14, at least the top surface of substrate 12, and bonding wires 16. Contacts or solder balls 20 are attached to associated contact terminal pads 28 thereby allowing external electrical elements to be electrically connected to integrated circuit die 14. This arrangement represents the typical prior art PBGA integrated circuit package.

The present invention provides a novel method of producing an Ultra Thin Ball Grid Array which can result in a PBGA package thinner than possible using prior art methods of producing BGA packages. This is accomplished by minimizing or eliminating the thickness of the substrate (i.e. substrate 12 of the prior art embodiment described above) and instead using a temporary supporting substrate or carrier to support the other components of an integrated circuit package during the assembly of the package. As will be described in more detail hereinafter, this novel method also provides a less expensive package by reducing the overall substrate cost by maximizing the substrate panel utilization as well as increase the substrate yield.

SUMMARY OF THE INVENTION

As will be described in more detail hereinafter, a method of manufacturing an integrated circuit package assembly including (i) an integrated circuit die having a bottom surface and a plurality of input/output terminals, (ii) electrically conductive traces and/or contacts accessible from outside the assembly, and (iii) an encapsulating material encapsulating the integrated circuit die and portions of the electrically conductive traces and/or contacts will be disclosed. The method includes the following steps. First, a temporary support substrate or carrier having a top surface is provided for supporting the integrated circuit package as the package is being assembled. Then, the integrated circuit die is detachably supported on the top surface of the temporary support substrate. Each of the input/output terminals on the integrated circuit die are electrically connected to the electrically conductive traces and/or contacts. Next, the integrated circuit die and at least a portion of the electrically conductive traces and/or contacts are encapsulated with the encapsulating material such that the bottom surface of the integrated circuit die supported by the temporary support substrate is not covered by the encapsulating material. Finally, the encapsulated integrated circuit die is detached from the temporary support substrate.

In one embodiment of the present invention, the integrated circuit package assembly includes a dielectric substrate, an integrated circuit die, an array of bonding wires, and an encapsulating material. The dielectric substrate has a horizontal top surface, a horizontal bottom surface, an outermost peripheral edge, a central opening defining an innermost edge, and a plurality of electrically conductive traces and/or contacts accessible from outside the assembly. The integrated circuit die has a horizontal top surface, a horizontal bottom surface, an outermost peripheral edge, and a plurality of input/output terminals. The integrated circuit die is positioned within the central opening of the substrate such that the bottom surface of the die and the bottom surface of the substrate substantially lie in a common plane. Each of the bonding wires making up the array of bonding wires electrically connects a respective one of the input/output terminals of the integrated circuit die to an associated one of the plurality of electrically conductive traces and/or contacts so that the die is electrically accessible from outside the assembly. And, the encapsulating material is integrally formed around and encapsulates the top surfaces and at least some of the edges of the substrate and the integrated circuit die and also surrounds and encapsulates the array of bonding wires such that the bottom surfaces of the substrate and die are not encapsulated by the integrally formed encapsulating material.

In another embodiment, the integrated circuit package assembly includes a dielectric flex tape substrate, and integrated circuit die, and an encapsulating material. The dielectric flex tape substrate has a horizontal top surface, a horizontal bottom surface, an outermost peripheral edge, and a plurality of electrically conductive traces and/or contacts accessible from outside the assembly. The integrated circuit die has a horizontal top surface, a horizontal bottom surface, an outermost peripheral edge, and a plurality of input/output terminals. The bottom surface of the integrated circuit die is attached to the top surface of the flex tape substrate. The integrated circuit package also includes a plurality of electrically conductive bonding wires or contacts for electrically connecting respective ones of the input/output terminals of the integrated circuit die to associated ones of the electrically conductive traces and/or contacts of the dielectric flex tape substrate. The encapsulating material is integrally formed around and encapsulating the top surface of the flex tape substrate, the top surface and peripheral edge of the integrated circuit die, and the electrically conductive bonding wires or contacts such that the bottom surface of the flex tape substrate is not encapsulated by the integrally formed encapsulating material. The flex tape substrate is sufficiently flexible such that it is not able to support by itself the integrated circuit die and the electrically conductive bonding wires or contacts without the support of the integrally formed encapsulating material.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

Figure 1:
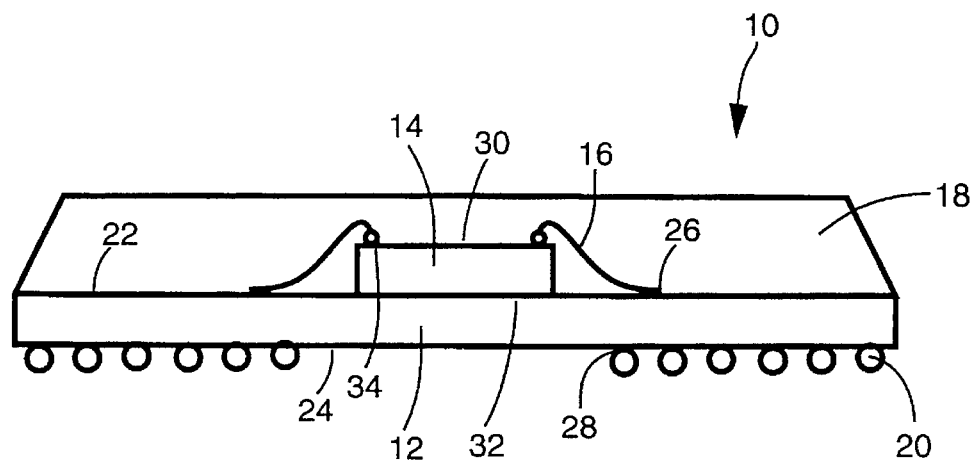
FIG. 1 is a diagrammatic cross sectional view of a prior art plastic ball grid array integrated circuit package.

Inasmuch as FIG. 1 was discussed previously, attention is directed to FIGS. 2–6 which illustrate integrated circuit packages in accordance with the present invention wherein like components are represented by like reference numerals. The integrated circuit packages shown in these figures are produced using the method of the present invention in which a temporary support substrate or carrier supports an integrated circuit die while the die is assembled into an integrated circuit package. The use of the temporary support substrate carrier eliminates the need to use a rigid substrate (i.e. substrate 12 of the prior art example described above) to support the die while the die is assembled into an integrated circuit package. By eliminating or significantly reducing the thickness of the substrate a thinner overall package may be produced.

Figure 2A:
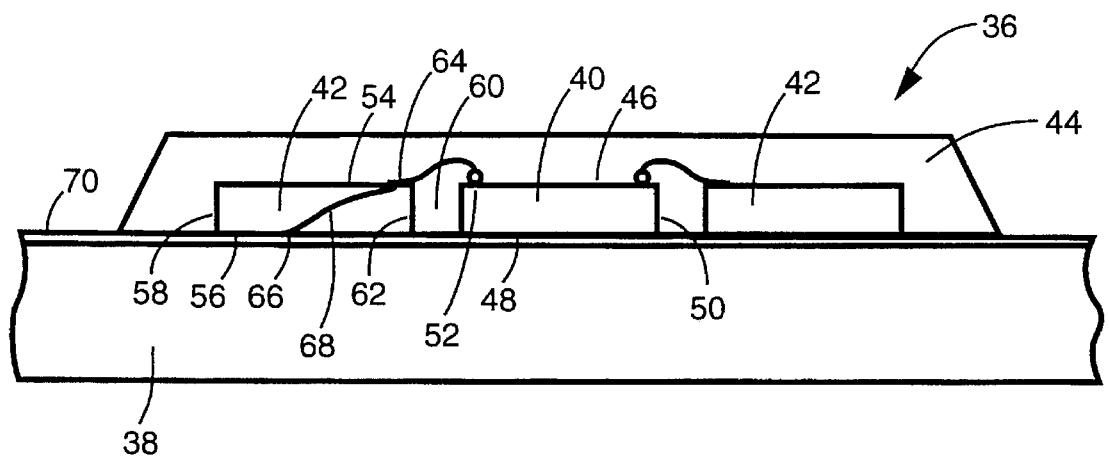
FIG. 2A is a diagrammatic cross sectional view of a first embodiment of an integrated circuit package in accordance with the present invention after being assembled on a temporary support substrate and before it is removed from the temporary support substrate.
Figure 2B:
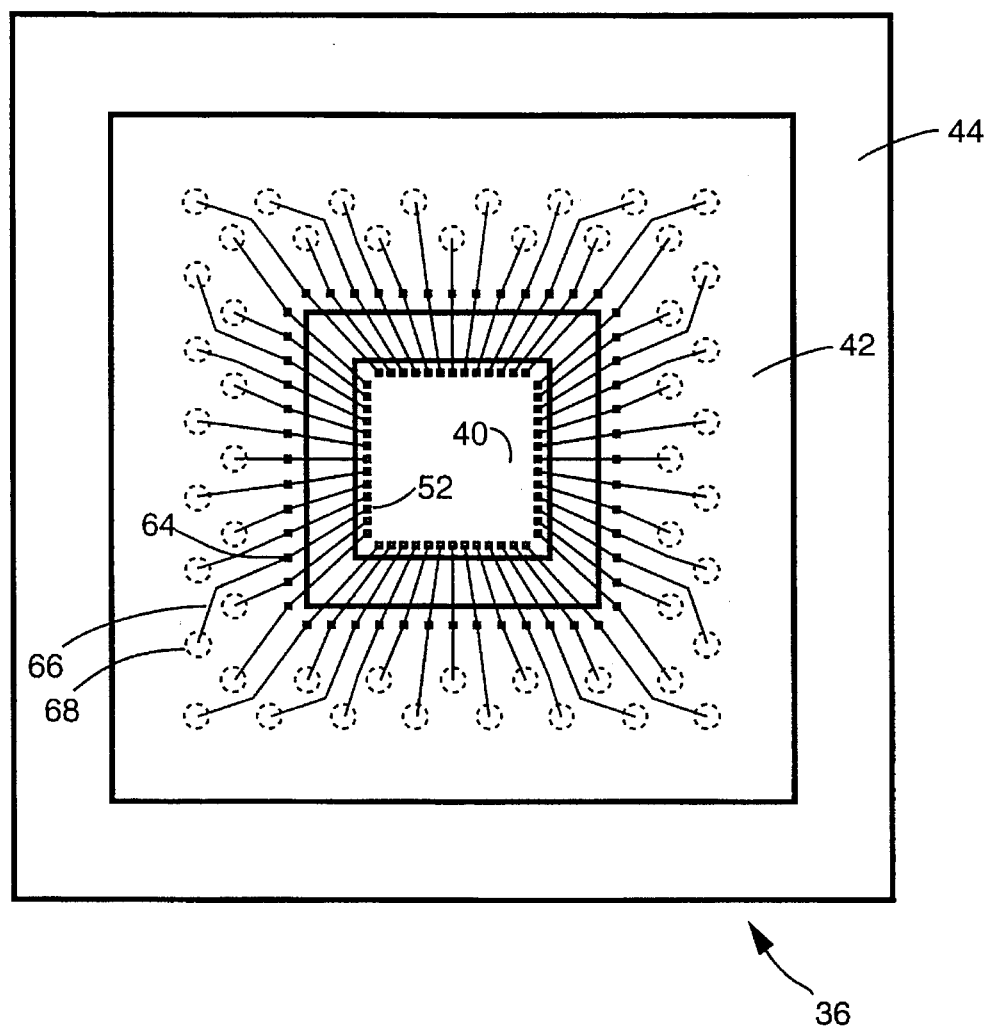
FIG. 2B is a diagrammatic plan view of the integrated circuit package shown in FIG. 2A.

Referring initially to FIGS. 2A and 2B, an integrated circuit package assembled using the method of the present invention and generally designated by reference numeral 36 will be described. Integrated circuit package 36 includes an integrated circuit die 40, a dielectric substrate 42, and an encapsulating material 44. Integrated circuit die 40 has a top surface 46, a bottom surface 48, an outermost peripheral edge 50, and includes a plurality of input/output terminals 52 located on top surface 46 of integrated circuit die 40. Dielectric substrate 42 has a top surface 54, a bottom surface 56, an outermost peripheral edge 58, and a central opening 60 defining an innermost edge 62. Dielectric substrate 42 also includes a plurality of terminal pads 64 on its top surface 54, an array of contact terminals 66 on its bottom surface 56, and a plurality of electrically conductive traces represented schematically by lines indicated by reference numeral 68. Each trace 68 electrically interconnects a respective one of the terminal pads 64 on the substrate's top surface to an associated contact terminal 66 on the substrate's bottom surface.

In accordance with the method being described, integrated circuit die 40 and substrate 42 are detachably supported on temporary support substrate carrier 38 such that integrated circuit die 40 is positioned within central opening 60 of substrate 42 and such that the bottom surfaces of die 40 and substrate 42 lie substantially in a common plane. In the embodiment shown in FIG. 2A, die 40 and substrate 42 are attached to substrate carrier 38 using a double sided adhesive tape material 70. One example of such an adhesive material is double sided polyimide tape. Although polyimide tape is given as one example of how die 40 and substrate 42 may be attached to substrate carrier 38, it should be understood that a wide variety of materials may be used. Reworkable adhesives such as thermoplastics, other types of double side adhesive tapes, and a wide variety of other attaching materials and mechanisms all fall within the spirit and scope of the described invention.

Integrated circuit package 36 further includes an array of bonding wires 72. Each bonding wire is electrically connected between a respective one of input/output terminals 52 on die 40 to an associated terminal pad 64 on substrate 42. This electrical connection of die 40 to substrate 42 allows integrated circuit die 40 to be electrically connected to other electrical elements through contact terminals 66 on bottom surface 56 of substrate 42 in the same manner as other conventional integrated circuit packages.

Once integrated circuit die 40 is electrically connected to substrate 42 using bonding wires 72, encapsulating material 44 is integrally formed around bonding wires 72 and the top surfaces and at least some of the edges of substrate 42 and die 40. This encapsulation of die 40 and substrate 42 mechanically interconnects die 40 and substrate 42 forming a rigid package which may now be removed from substrate carrier 38. As shown in FIG. 2A, this encapsulating material does not cover bottom surface 48 of die 40 and bottom surface 56 of substrate 42. Also, it should be noted that, in accordance with the present invention, until encapsulating material 44 is integrally formed around die 40 and substrate 42, substrate carrier 38 is required in order to provide a stable, rigid substrate for assembling package 36.

Figure 3:
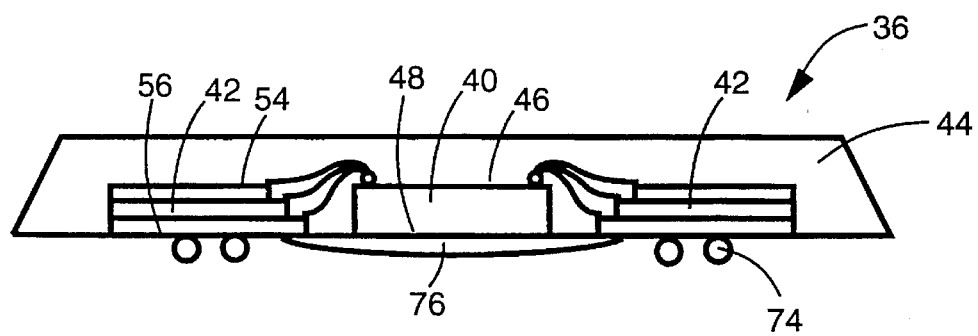
FIG. 3 is a diagrammatic cross sectional view of a second embodiment of an integrated circuit package in accordance with the present invention.

As shown in FIG. 3, after integrated circuit package 36 has been removed from temporary support substrate carrier 38, a plurality of electrically conductive contacts or solder balls are attached to respective ones of the contact terminals 66 on the bottom surface 56 of dielectric substrate 42. This is done in the conventional manner for ball grid array packages. Also, since bottom surface 48 of integrated circuit die 40 has not been encapsulated by encapsulating material 44, an additional covering material 76 may be applied to bottom surface 48 in order to protect die 40 from chipping or from moisture and other contaminants. In situations in which heat dissipation from die 40 is a specific concern, covering material 76 may be selected to be a particularly thermally conductive material. Alternatively, die 40 may be left uncovered so that it may be directly attached to a heat spreader or heat sink on a system board or device in which integrated circuit package 36 is ultimately going to be used. Therefore, the above described integrated circuit package provides a wide variety of options for dissipating heat from the integrated circuit die which are not typically available with prior art ball grid array packages.

As shown in FIG. 3 and in accordance with the present invention, integrated circuit package 36 is able to be manufactured thinner than other prior art packages. This is because the substrate which is required to support the integrated circuit die in prior art packages has been eliminated below the die. This elimination of the substrate below the die reduces the minimum thickness of the package by the thickness of the substrate (i.e. substrate 12 of the prior art package shown in FIG. 1) and the thickness of any die attach material typically used to attach the die to the substrate.

Although dielectric substrate 42 was shown as a single layered substrate in FIG. 2A, it should be understood that the present invention is not limited to single layered substrates. As shown in FIG. 3, dielectric substrate 42 may be a multi-layered dielectric substrate. Also, it should be understood that the dielectric substrate may take a wide variety of forms. Since the substrate is supported by the temporary support substrate carrier until encapsulated by the encapsulating material, the dielectric substrate itself is not required to be rigid. Therefore, substrate may be made up of a flexible material such as a dielectric flex tape substrate. Since flex tape substrates currently offer the highest trace densities compared to other substrates, the above described method allows for higher density plastic ball grid array packages than prior art PBGA packages. Alternatively, substrate 42 may be a printed wiring board or any other conventional substrate material and still remain within the scope of the present invention. Furthermore, although the substrate has been described and shown as having a central opening in which the die is located, it should be understood that the substrate may take on a wide variety of particular shapes. For example, the substrate may be made up of two separate strips positioned on opposite sides of the die and still remain within the spirit and scope of the present invention.

An additional advantage of the present invention is that it reduces the cost of the package by allowing for maximizing the panel utilization of the dielectric substrate and improving the yield of the substrate compared to the conventional methods. This is because each substrate is attached to the substrate carrier individually rather than in a strip form as in conventional methods. Therefore, defective substrates result in wasting only the one defective substrate rather than an entire strip of substrates. Also, using the individual substrates eliminates the need for an expensive singulation tool or die which is typically used to separate individual packages in conventional methods. Furthermore, since the die is not attached to the substrate in the conventional manner, no die attach material is used and no curing of the die attach material is required, further reducing the cost. Instead the die is directly attached to the adhesive tape or material on the temporary support substrate carrier using, for example, a standard die attaching machine.

Figure 4A:
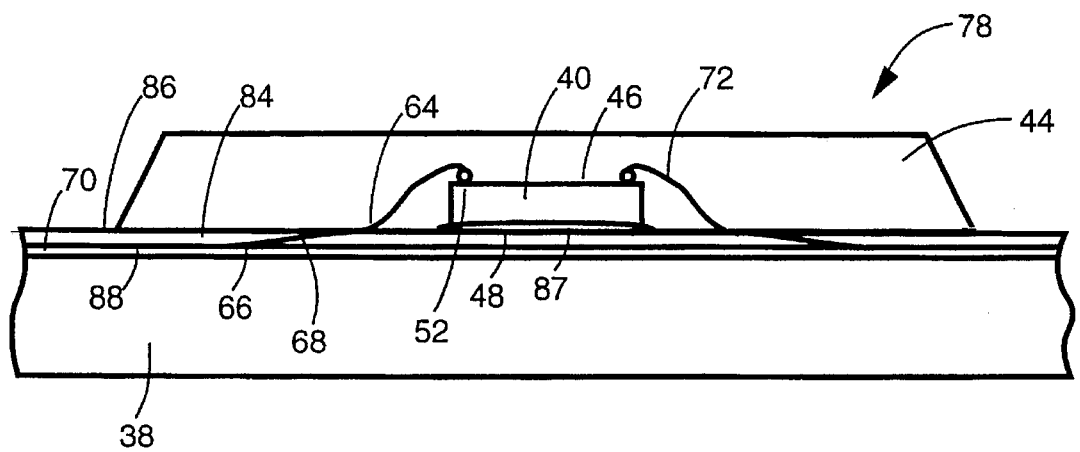
FIG. 4A through 4C are diagrammatic cross sectional views of three additional embodiments of an integrated circuit package in accordance with the present invention after being assembled on a temporary support substrate and before being removed from the temporary support substrate.
Figure 4B:
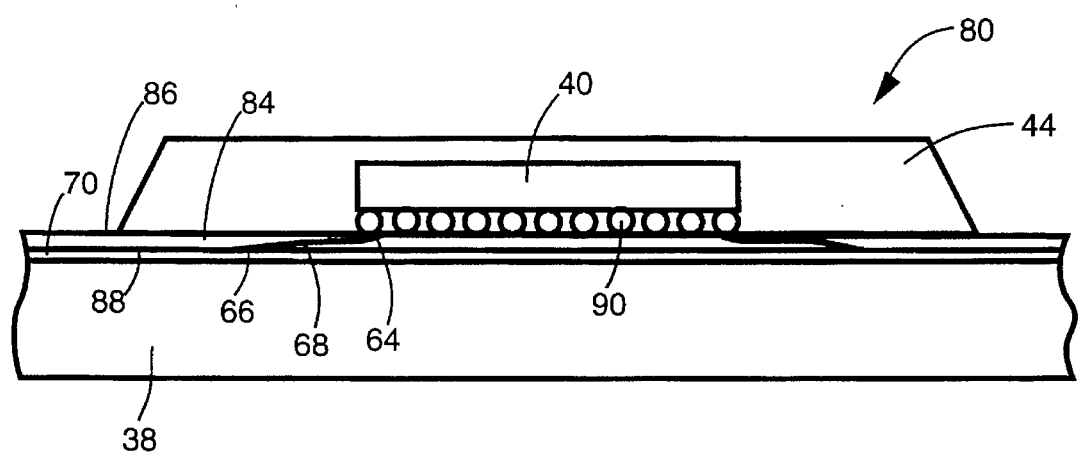
Figure 4C:
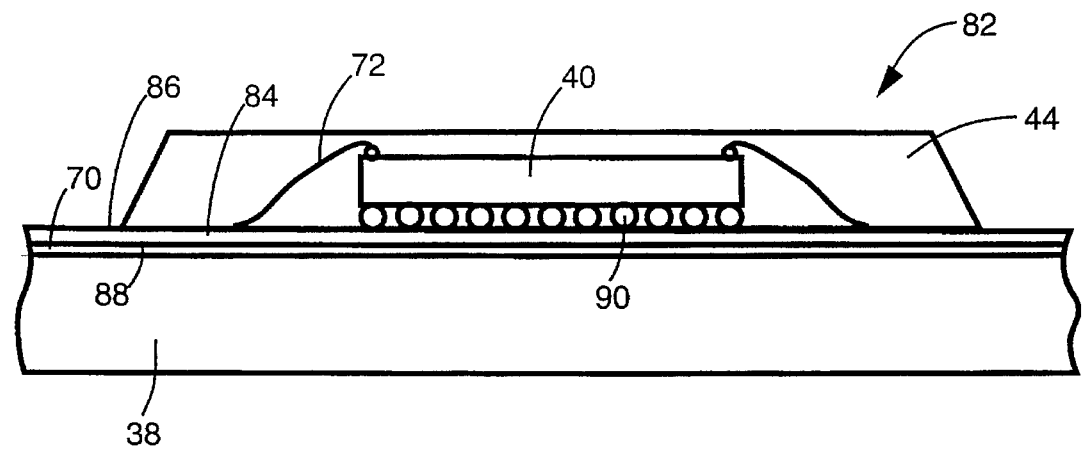

Referring to FIGS. 4A–C, three additional embodiments of an integrated circuit package in accordance with the present invention and generally indicated by reference numerals 78, 80 and 82 respectively will be described. Integrated circuit package 78 is similar to the package described above in that it is assembled on temporary support substrate carrier 38 and it includes die 46, bonding wires 72, and encapsulating material 44. However, package 78 includes a dielectric flex tape substrate 84 having a top surface 86 and a bottom surface 88. Flex tape substrate 84 is attached to substrate carrier 38 in the same way as described above except that there is no opening formed in flex tape substrate 84 for die 40 to fit within. Instead bottom surface 48 of die 40 is attached to top surface 86 of substrate 84 using, for example, conventional die attach material 87. In accordance with the present invention, substrate 84 is sufficiently flexible that it is not able to, by itself, support integrated circuit die 40 without the support of either temporary support substrate carrier 38 during the assembly of the package or encapsulating material 44 after the assembly of the package. As described above for dielectric substrate 42, flex tape substrate 84 includes terminal pads 64 on its top surface, contact terminals 66 on its bottom surface and traces interconnecting respective terminal pads 64 to associated contact terminals 66 which are schematically represented by lines 68. Also as described above for package 36, an array of bonding wires 72 are electrically connected between respective input/output terminals on the top surface of die 40 and associated terminal pads 64 on the top surface of flex tape substrate 84. This allows other elements to be electrically connected to die 40 through the contact pads on the bottom of substrate 84.

Alternatively, as shown in FIG. 4B, die 40 may be electrically connected to substrate 84 using the flip chip method. With this method, an array of contacts or solder balls 90 are attached to the input/output terminals of die 40. Die 40 is then flipped over and solder balls 90 are used to electrically connect respective input/output terminals on die 40 to associated terminal pads on flex tape substrate 84. As shown in FIG. 4C, a combination of bonding wires and the flip chip method may be used to electrically connect die 40 to substrate 84 if the integrated circuit die has terminal pads formed on both its top and bottom surface.

Once the wire bonding process and/or the flip chip process is complete, encapsulating material 44 is integrally formed around bonding wires 72 (if present), integrated circuit die 40, and at least portions of the top surface 86 of substrate 84. This encapsulation of die 40 and substrate 84 forms a rigid package which may now be removed from substrate carrier 38. The encapsulating material does not cover bottom surface 88 of substrate 84 and, as described above, substrate carrier 38 is required in order to provide a stable, rigid substrate for assembling package 78, 80, and 82 until encapsulating material 44 is integrally formed around die 40 and on substrate 84.

In the same way as described above for package 36, after integrated circuit package 78, 80 and 82 have been removed from temporary support substrate carrier 38, a plurality of electrically conductive contacts or solder balls are attached to respective ones of the contact terminals on the bottom surface of flex tape substrate 84. With this described arrangement, the integrated circuit package is able to be manufactured thinner than other prior art packages. This is because the thickness of substrate 84 has been minimized and is substantially thinner than the substrate which is required to support the integrated circuit die in prior art packages. Also, as mentioned above, this method of producing an integrated circuit package allows a high trace density flex tape substrate to be used in a PBGA package therefore allowing a higher density PBGA package to be produced.

Figure 5:
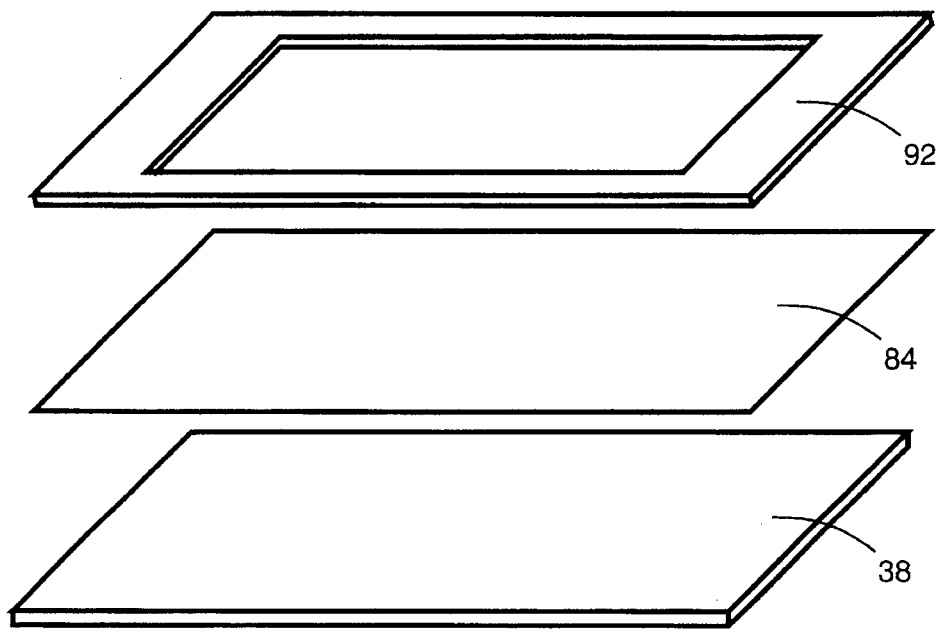
FIG. 5 is a diagrammatic orthographic view of a clamping arrangement for temporarily attaching a flex tape substrate to a temporary support substrate in accordance with the present invention as an integrated circuit package is assembled on the temporary support substrate.

Referring to FIG. 5, alternative methods of attaching flex tape substrate 84 to temporary support substrate 38 may by used. For example, as illustrated in FIG. 5, a mechanical clamping arrangement may be employed. The particular embodiment of the clamping arrangement shown includes a clamping frame 92 which attaches to temporary support substrate carrier 38 using conventional clamping devices or fasteners. This arrangement mechanically holds substrate 84 in place as the assembly process proceeds. A wide variety of other mechanical clamping arrangements may be used and should be clear to those skilled in the art in view of the above disclosure.

Figure 6:
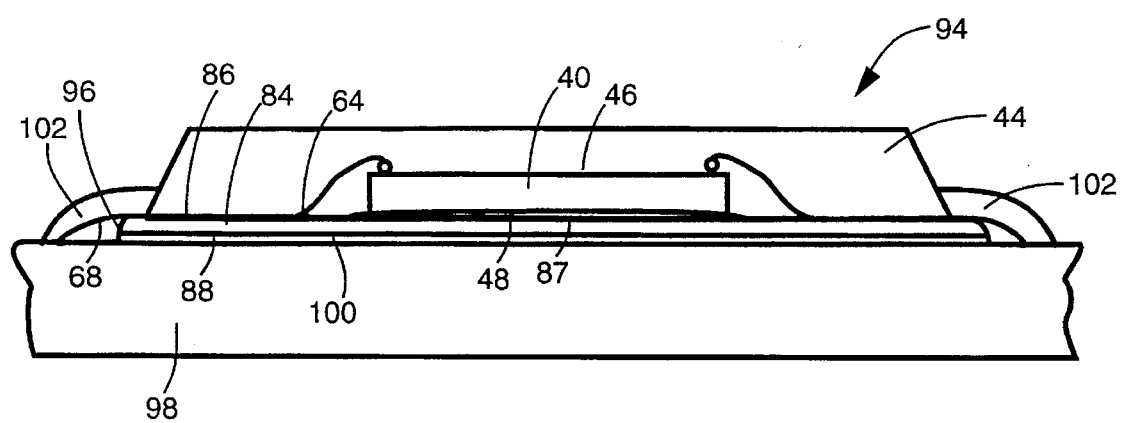
FIG. 6 is a diagrammatic cross sectional view of another embodiment of an integrated circuit package in accordance with the present invention.

In an additional embodiment illustrated in FIG. 6, an integrated circuit package generally designated by reference numeral 94 uses a different arrangement for electrically connecting package 94 to other elements. As shown in FIG. 6, package 94 includes integrated circuit die 40, bonding wires 72, flex tape substrate 84, and encapsulating material 44 as were described above. However, in this embodiment flex tape substrate 84 has an outermost peripheral edge 96 and does not include contact terminals 66 on its bottom surface. Instead, electrically conductive traces, indicated by line 68, extend outwardly along the top surface of substrate 84 beyond peripheral edge 96 of substrate 84 rather than through substrate 84 as described in the previous embodiments. As described above, traces 68 are electrically connected to terminal pads 64 on the top surface of flex tape substrate 84, however, in this embodiment they extend outwardly along the top surface of substrate 84 beyond peripheral edge 96 rather than electrically connecting terminal pads 64 to contact terminals on the bottom surface of substrate 84. These traces which extend beyond outermost peripheral edge 96 allow integrated circuit package 94 to be electrically connected to other electrical elements such as a system board.

As shown in FIG. 6, package 94 may be mechanically attached to a system board 98 after it has been assembled in the manner described above. For example, a thermally conductive adhesive 100 may be used to attach package 94 to the system board, thus providing good thermal dissipation of heat from the integrated circuit die. This overall arrangement provides an extremely thin integrated circuit package by eliminating the thickness of the solder ball contacts of the above described embodiments. Also, as indicated in FIG. 6, after traces 68 have been electrically connected to appropriate terminal pads or contacts on the system board, an encapsulating material 102 may be formed over the exposed portions of traces 68 which extend beyond package 94. This encapsulating material would protect these outer portions of traces 68 from moisture and other corrosive elements. This same approach of extending the traces beyond the outermost peripheral edge of the package may be incorporated into integrated circuit package 36 described above to provide an even thinner integrated circuit package. This package would eliminate entirely the substrate thickness below the die as well as the thickness of the solder balls.

Although the embodiments described above only include a single integrated circuit die 40, it should be understood that the present invention equally applies to integrated circuit packages having multiple die or other electronic devices in place of the integrated circuit die. Also, it should be understood that the temporary support substrate carrier may take on a wide variety of forms. For example the carrier may be designed to support only one integrated circuit package at a time, or alternatively, may support a plurality of packages.

Therefore, the present examples are to be considered as illustrative and not restrictive, and the invention is not to be limited to the details given herein, but may be modified within the scope of the appended claims.

What is claimed is:

1. A method of manufacturing an integrated circuit package assembly including (i) an integrated circuit die having a bottom surface and a plurality of input/output terminals, (ii) electrically conductive means accessible from outside said assembly, and (iii) an encapsulating material encapsulating said integrated circuit die and portions of said electrically conductive means, said method comprising the steps of:
   a) providing a temporary support substrate having a top surface for supporting said integrated circuit package as said package is being assembled;
   b) detachably supporting said integrated circuit die on the top surface of said temporary support substrate;
   c) electrically connecting each of said input/output terminals on said integrated circuit die to said electrically conductive means;
   d) encapsulating said integrated circuit die and at least a portion of said electrically conductive means with said encapsulating material such that the bottom surface of said integrated circuit die supported by said temporary support substrate is not covered by said encapsulating material; and
   f) detaching said encapsulated integrated circuit die from said temporary support substrate.

2. A method according to claim 1 including a dielectric substrate at least in part providing said electrically conductive means, said dielectric substrate having a horizontal top surface, a horizontal bottom surface, an outermost peripheral edge, and a central opening defining an innermost edge, and wherein said step of detachably supporting said integrated circuit die on the top surface of said temporary support substrate includes the step of detachably attaching said integrated circuit die directly on said temporary support substrate within said central opening of said dielectric substrate and detachably attaching said dielectric substrate directly on said temporary support substrate such that the bottom surface of said die and the bottom surface of said dielectric substrate substantially lie in common plane.

3. A method according to claim 2 wherein said dielectric substrate is a multi-layered substrate having a plurality of vertically stepped horizontal top surfaces along said innermost edge corresponding to the layers making up the multi-layered substrate.

4. A method according to claim 2 wherein said dielectric substrate and said integrated circuit die are detachably attached directly to said temporary support substrate using a double sided polyimide adhesive tape.

5. A method according to claim 2 wherein said dielectric substrate is a dielectric polyimide flex tape.

6. A method according to claim 2 wherein said dielectric substrate is a printed wiring board.

7. A method according to claim 2 wherein;
   a) said dielectric substrate includes a plurality of contact terminals on the bottom surface of said dielectric substrate, a plurality of terminal pads on the top surface of said dielectric substrate, and a plurality of traces, each of said traces of said dielectric substrate electrically connecting a respective one of said contact terminals on the bottom of said dielectric substrate to an associated one of said terminal pads on the top surface of said dielectric substrate, and
   b) said method further includes the step of, after the step of detaching said encapsulated integrated circuit die from said temporary support substrate, attaching an array of electrically conductive contacts to respective ones of said contact terminals on the bottom of said dielectric substrate, said contacts providing means for electrically connecting said integrated circuit package to other electrical elements.

8. A method according to claim 7 wherein said contacts are solder balls.

9. A method according to claim 7 further including the step of covering the bottom surface of said integrated circuit die with material apart from said encapsulating material.

10. A method according to claim 2 wherein said dielectric substrate includes a plurality of traces extending outwardly beyond the outermost peripheral edge of said dielectric substrate which are adapted to electrically connect said integrated circuit package to other electrical elements.

11. A method according to claim 1 including a dielectric flex tape substrate providing at least a portion of said electrically conductive means, said dielectric flex tape substrate having a horizontal top surface and a horizontal bottom surface and said dielectric flex tape substrate being sufficiently flexible such that it is not able to support by itself said integrated circuit die and said electrically conductive means without the support of said temporary support substrate and wherein said step of detachably supporting said integrated circuit die on the top surface of said temporary support substrate includes the step of detachably attaching said dielectric flex tape substrate directly on said temporary support substrate and the step of attaching said integrated circuit die to the top surface of said dielectric flex tape substrate.

12. A method according to claim 11 wherein said dielectric flex tape substrate is detachably attached to said carrier plate using a double sided polyimide adhesive tape.

13. A method according to claim 11 wherein said dielectric flex tape substrate is detachably attached to said carrier plate using a mechanical clamping arrangement.

14. A method according to claim 11 wherein:
a) said input/output terminal pads on said integrated circuit die are located on said bottom surface of said integrated circuit die;
b) said dielectric flex tape substrate includes a plurality of terminal pads on the top surface of said dielectric flex tape substrate; and
c) said the step of attaching said integrated circuit die to the top surface of said dielectric flex tape substrate includes the step of using an array of contacts to electrically interconnect respective ones of said input/output terminal pads on said integrated circuit die to associated terminal pads on the top surface of said flex tape substrate.

15. A method according to claim 14 wherein said contacts are solder balls.

16. A method according to claim 14 wherein:
a) said integrated circuit die includes additional input/output terminal pads located on the top surface of said integrated circuit die; and
b) said step of attaching said integrated circuit die to the top surface of said dielectric flex tape substrate further includes the step of using an array of bonding wires to electrically interconnect respective ones of said additional input/output terminal pads on the top surface of said integrated circuit die to associated terminal pads on the top surface of said dielectric flex tape substrate.

17. A method according to claim 11 wherein:
a) said input/output terminal pads on said integrated circuit die are located on the top surface of said integrated circuit die;
b) said dielectric flex tape substrate includes a plurality of terminal pads on the top surface of said dielectric flex tape substrate; and
c) said step of attaching said integrated circuit die to said top surface of said dielectric flex tape substrate includes the step of using an array of bonding wires to electrically interconnect respective ones of said input/output terminal pads on said integrated circuit die to associated terminal pads on the top surface of said dielectric flex tape substrate.

18. A method according to claim 11 wherein said dielectric flex tape substrate is a polyimide tape.

19. A method according to claim 11 wherein:
a) said dielectric flex tape substrate includes a plurality of contact terminals on the bottom surface of said dielectric flex tape substrate, a plurality of terminal pads on the top surface of said dielectric flex tape substrate, and a plurality of traces, each of said traces electrically connecting a respective one of said contact terminals on the bottom of said substrate to an associated one of said terminal pads on the top surface of said substrate, and
b) said method further includes the step of attaching an array of electrically conductive contacts to respective ones of said contact terminals on the bottom of said dielectric flex tape substrate for electrically connecting said integrated circuit package to external electrical elements.

20. A method according to claim 19 wherein said contacts are solder balls.

21. A method according to claim 11 wherein said dielectric flex tape substrate includes a plurality of traces extending outwardly beyond the outermost peripheral edge of said dielectric flex tape substrate, said traces being adapted to electrically connect said integrated circuit package to other electrical elements.

* * * * *

UNITED STATES PATENT AND TRADEMARK OFFICE
CERTIFICATE OF CORRECTION

PATENT NO. : 5,620,928
DATED : April 15, 1997
INVENTOR(S) : LEE et al.

It is certified that error appears in the above-indentified patent and that said Letters Patent is hereby corrected as shown below:

Column 8, line 42, after "in", insert --a--.

Signed and Sealed this

Twenty-ninth Day of July, 1997

Attest:

BRUCE LEHMAN

*Attesting Officer*      *Commissioner of Patents and Trademarks*